(12) United States Patent
Kim et al.

(10) Patent No.: US 8,134,172 B2
(45) Date of Patent: Mar. 13, 2012

(54) LED AND FABRICATION METHOD THEREOF

(75) Inventors: Sang Kee Kim, Gwangju-si (KR); Song Jae Lee, Daejeon-si (KR); Hea Jung Jung, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 132 days.

(21) Appl. No.: 10/565,832

(22) PCT Filed: Aug. 24, 2004

(86) PCT No.: PCT/KR2004/002126
§ 371 (c)(1),
(2), (4) Date: Jul. 17, 2006

(87) PCT Pub. No.: WO2005/022656
PCT Pub. Date: Mar. 10, 2005

(65) Prior Publication Data
US 2007/0023771 A1    Feb. 1, 2007

(30) Foreign Application Priority Data

Sep. 1, 2003  (KR) ............. 10-2003-0060897
Sep. 22, 2003 (KR) ............. 10-2003-0065634

(51) Int. Cl.
*H01L 33/00* (2010.01)

(52) U.S. Cl. ............... 257/99; 257/E33.064

(58) Field of Classification Search .............. 257/99
See application file for complete search history.

(56) References Cited

U.S. PATENT DOCUMENTS

| | | | |
|---|---|---|---|
| 6,291,839 B1 | 9/2001 | Lester | |
| 6,614,056 B1* | 9/2003 | Tarsa et al. | 257/91 |
| 6,809,308 B2* | 10/2004 | Yonezawa et al. | 250/214.1 |
| 6,903,374 B2* | 6/2005 | Katayama | 257/79 |
| 6,967,981 B2* | 11/2005 | Chua et al. | 372/46.01 |
| 2002/0130327 A1 | 9/2002 | Wu et al. | |
| 2003/0062530 A1 | 4/2003 | Okazaki et al. | |

FOREIGN PATENT DOCUMENTS

| | | |
|---|---|---|
| JP | 11-204832 A | 7/1999 |
| KR | 10-2003-0065884 A | 8/2003 |
| KR | 423185 B | 3/2004 |
| WO | WO-03/007390 A1 | 1/2003 |

* cited by examiner

*Primary Examiner* — Jerome Jackson, Jr.
(74) *Attorney, Agent, or Firm* — Birch, Stewart, Kolasch & Birch, LLP

(57) ABSTRACT

A light emitting diode is provided. The diode includes: a substrate; a first nitride gallium layer disposed above the substrate; a first electrode provided at one portion of and above the first nitride gallium layer; an active layer provided above the first nitride gallium layer, for emitting light; a second nitride gallium layer provided above the active layer; and transparent electrodes spaced apart from one another above the second nitride gallium layer.

7 Claims, 12 Drawing Sheets

LED AND FABRICATION METHOD THEREOF

TECHNICAL FIELD

The present invention relates to a light emitting diode and a fabrication method thereof, and more particularly, to a light emitting diode and a fabrication method thereof in which a transparent electrode can be partitioned at a light emission region to improve a light efficiency.

BACKGROUND ART

Generally, light emitting diode (LED) is a kind of a semiconductor device, and it converts electricity into infrared ray or light by using a characteristic of a compound semiconductor, to send and receive a signal. The LED is used for home appliances, a remote controller, an electronic display board, a displaying apparatus, a variety of automation apparatuses and the like.

An operation principle of the LED will be briefly described in the following.

When a forward voltage is applied to a semiconductor of a specific chemical element, electrons and holes are recombined with each other while moving through a positive-negative junction. The recombination of the electrons and the holes causes an energy level to fall down, thereby emitting light.

Further, the LED is generally manufactured to have a very small size of 0.25 mm$^2$ and is mounted on a lead frame or a printed circuit board (PCB) using has an epoxy mold.

Representative of the LEDs is a plastic package of 5 mm (T 1¾) or a new package being developed in a specific application field.

A color of light emitted from the LED is determined by a wavelength obtained depending on a combination of elements constituting a semiconductor chip.

Particularly, as an information communication apparatus is in a trend of a small size and slimness, the communication apparatus has more miniaturized parts such as a resistance, a condenser, and a noise filter. The LED is manufactured in a form of a Surface mounted Device (Hereinafter, referred to as "SMD") so as to be directly mounted on a Printed Circuit Board (Hereinafter, referred to as "PCB").

Accordingly, an LED lamp for a display device is being developed in the form of the SMD. Such an SMD can substitute a related-art simple lamp. The SMD is used for a lamp display, a character display, an image display and the like that express various colors.

Further, as a high-density integration technology for a semiconductor device is developed and a consumer prefers a more compact electronic product, Semiconductor Mounting Technology (SMT) is widely used, and a packaging technology of the semiconductor device employs a technology for minimizing an installation space such as a Ball Grid Array (BGA), a wire bonding, and a flip chip bonding.

FIG. 1 is a view illustrating a related art light emitting diode.

As shown in FIG. 1, after an N-type nitride gallium layer 102 is formed on a sapphire substrate 101, an N-type electrode 105 is formed at one portion of and on the N-type nitride gallium layer 102. A metal organic chemical vapor deposition (MOCVD) is used to form a film using a Group 3-based element on the sapphire substrate 101.

Silicon using silane (SiH$_4$) gas is used to form N-type dopants. All three-component nitride films are grown in an atmosphere of Hydrogen gas. Nitrogen gas is used to grow a nitride gallium.

After the N-type nitride gallium 102 is formed, an active layer 104 is formed on the N-type nitride gallium layer 102. The active layer 104 corresponding to a light emission region has a quantum well structure comprising a Indium gallium nitride. After the active layer 104 is formed, a P-type nitride gallium (GaN) layer 106 is formed.

The P-type nitride gallium layer 106, which is contrasted with the N-type nitride gallium layer 102, is formed by the addition of P-type dopants. Therefore, in the N-type nitride gallium layer 102, electrons are drifted by an external voltage. In the P-type nitride gallium layer 106, holes are drifted by the external voltage. The electrons and the holes are recombined with each other to emit light.

The transparent metal-based transparent electrode 107 is formed on the P-type nitride gallium layer 106 to allow light generated from the active layer 104 to be transmitted therethrough, and allow the generated light to be emitted to the external.

After the transparent electrode 107 is formed, a P-type electrode 103 is formed to compose the light emitting diode.

However, since the related-art light emitting diode using the sapphire substrate has a nitride film having a larger refractive index than the substrate, the light generated from the active layer is transmitted through the nitride film to be emitted toward the transparent electrode.

FIG. 2 is a plan view illustrating the transparent electrode, the P-type electrode, and the N-type electrode of the light emitting diode of FIG. 1.

As shown in FIG. 2, the P-type electrode 103 and the N-type electrode 105 are disposed at both portions of the light emitting diode 100, and the transparent electrode 107 is disposed on a whole region of the light emitting diode 100.

The transparent electrode 107 corresponds to a region at which the light generated from the active layer of the light emitting diode 100 is emitted. The transparent electrode 107 is formed of a transparent conductive metal.

FIGS. 3a and 3b are views illustrating a light emission region of a related art light emitting diode. As shown, it can be appreciated that the generated light is biased and concentrated at a predetermined region.

In other words, a light biased-concentration phenomenon occurs since a voltage applied to combine the holes and the electrons in the active layer is varied due to a resistance component centering on the N-type electrode. As a distance is increased from the N-type electrode, resistance is increased. Therefore, the increased resistance again results in a voltage drop.

Unlike this, the resistance is not varied depending on the distance at a region far away from the N-type electrode comparing to a region close to the N-type electrode. Therefore, a high current is applied to the active layer when a high voltage is applied to an electrode region.

If the high voltage is applied to the region close to the electrode region as described above, a temperature of the active layer rises. The rise of the temperature of the active layer causes a drop of a turn-on voltage of the light emitting diode to make worse the biased-concentration of a driving current.

Further, as shown in FIG. 3b, in case where the N-type electrode is disposed along a circumference of an upper edge of the light emitting diode, the light is biased and concentrated only at an N-type electrode region, which is close to the P-type electrode.

Specifically, the P-type electrode itself functions to block or absorb a portion of photons incident on the P-type electrode, thereby deteriorating an efficiency of light emission. If a thickness of the P-type electrode is decreased to prevent this, the resistance of the P-type electrode is relatively greatly increased. Accordingly, it cannot be expected that the light is emitted from the region far away from the n-type electrode.

The light biased-concentration phenomenon occurs because the voltage applied to the active layer is not constantly maintained at the whole region along the P-type electrode and the transparent electrode, due to the resistance increased at each distance away from the electrode and different voltage drops caused by the increased resistance at each upper electrode region.

Further, in case where the emitted light is reflected or absorbed by the P-type electrode, the light efficiency is deteriorated. Specifically, the light is absorbed at the transparent electrode formed of the transparent metal, an emitted amount of light is reduced.

Additionally, since most of the generated light of the light emitting diode is emitted through the transparent electrode to the external, the reduction of the light efficiency causes the reduction of an external quantum efficiency.

DISCLOSURE OF THE INVENTION

Accordingly, the present invention is directed to a light emitting diode and a fabrication method thereof that substantially obviate one or more problems due to limitations and disadvantages of the related art.

An object of the present invention is to provide a light emitting diode and a fabrication method thereof in which a plurality of transparent electrodes is partitioned and provided in the light emitting diode to constantly maintain a magnitude of a voltage applied to an active layer, thereby generating regular light from an upper region of the light emitting diode.

Another object of the present invention is to provide a light emitting diode and a fabrication method thereof in which a transparent electrode has a wholly stripe-shaped surface to improve an efficiency of light emitted to the external.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, there is provided a light emitting diode including: a substrate; a first nitride gallium layer disposed above the substrate; a first electrode provided at one portion of and above the first nitride gallium layer; an active layer provided at the other portion of and above the first nitride gallium layer, for emitting light; a second nitride gallium layer provided above the active layer; and transparent electrodes spaced apart from one another above the second nitride gallium layer.

In another aspect of the present invention, there is provided a light emitting diode having a first nitride gallium layer, an active layer, a second nitride gallium layer, a first electrode, and a second electrode above a sapphire substrate, the diode including: a plurality of transparent electrodes respectively provided at a plurality of partitioned regions excepting regions of the first electrode and the second electrode disposed at an upper layer; and a plurality of connection units for electrically connecting the plurality of transparent electrodes with the second electrode.

In a further another aspect of the present invention, there is provided a method of fabricating a light emitting diode, the method including the steps of: forming a stripe-shaped transparent electrode pattern using a stripe-shaped mask above a nitride gallium layer; depositing a transparent electrode above the stripe-shaped transparent electrode pattern; and etching-out the stripe-shaped transparent electrode pattern to form a stripe-shaped transparent electrode.

In a still another aspect of the present invention, there is provided a method of fabricating a light emitting diode, the method including the steps of: depositing a transparent electrode film above a nitride gallium layer, and coating a photoresist film above the transparent electrode film; exposing and developing the photoresist film by using a slit-shaped mask above the photoresist film, to form a stripe-shaped photoresist pattern; and etching the transparent electrode film along the stripe-shaped photoresist pattern to form a stripe-shaped transparent electrode.

In a still further another aspect of the present invention, there is provided a light emitting diode including: a substrate; a first nitride gallium layer formed above the substrate; an active layer formed above the second nitride gallium layer; a second nitride gallium layer formed above the active layer; a first electrode formed above the first nitride gallium layer; a second electrode formed above the second nitride gallium layer; and a plurality of transparent electrodes spaced apart from one another above the second nitride gallium layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

BEST MODE FOR CARRYING OUT THE INVENTION

Hereinafter, preferred embodiments of the present invention will be described in detail with reference to accompanying drawings.

Figure 1:
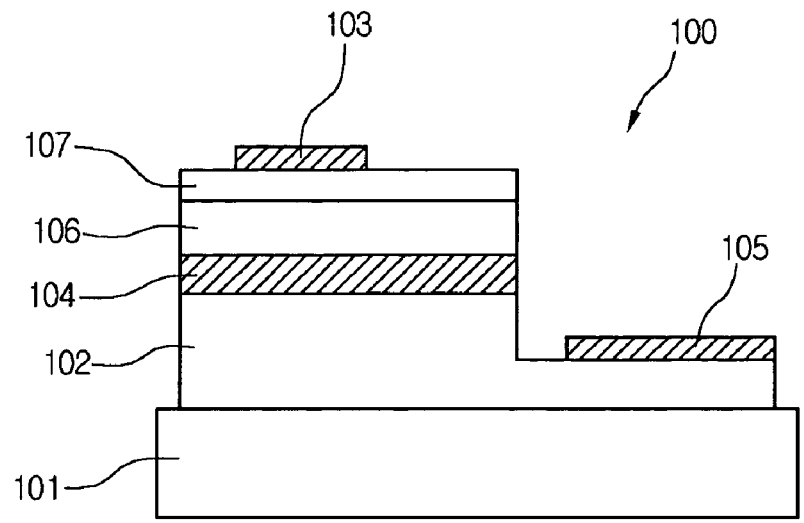
FIG. 1 is a view illustrating a related-art light emitting diode.
Figure 2:
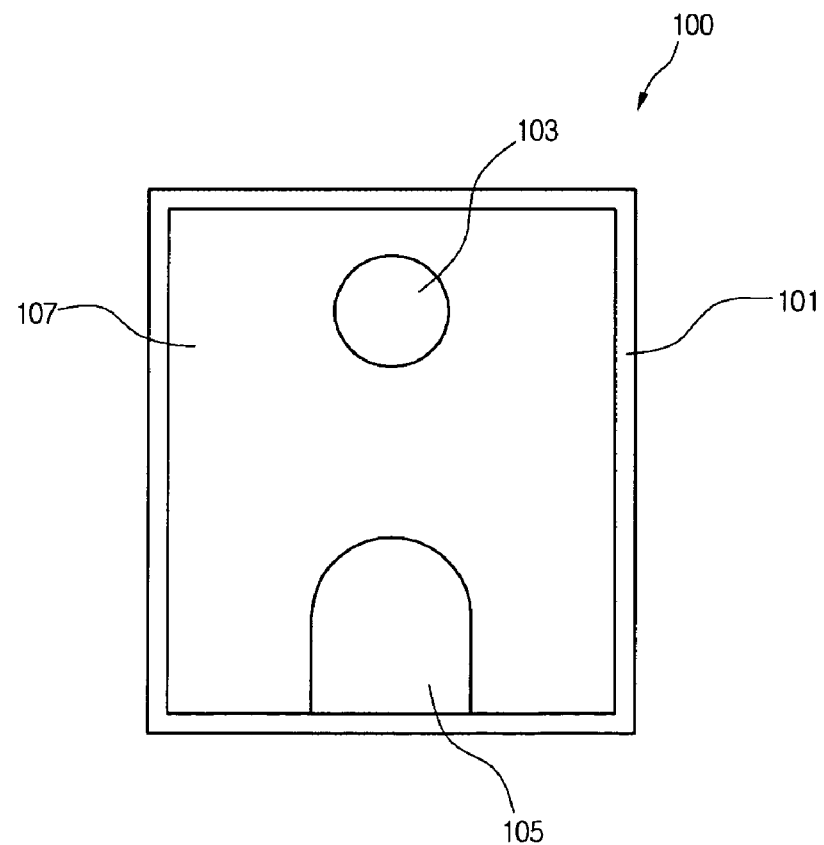
FIG. 2 is a plan view illustrating a transparent electrode, a P-type electrode, and an N-type electrode of a light emitting diode of FIG. 1.
Figure 3A:
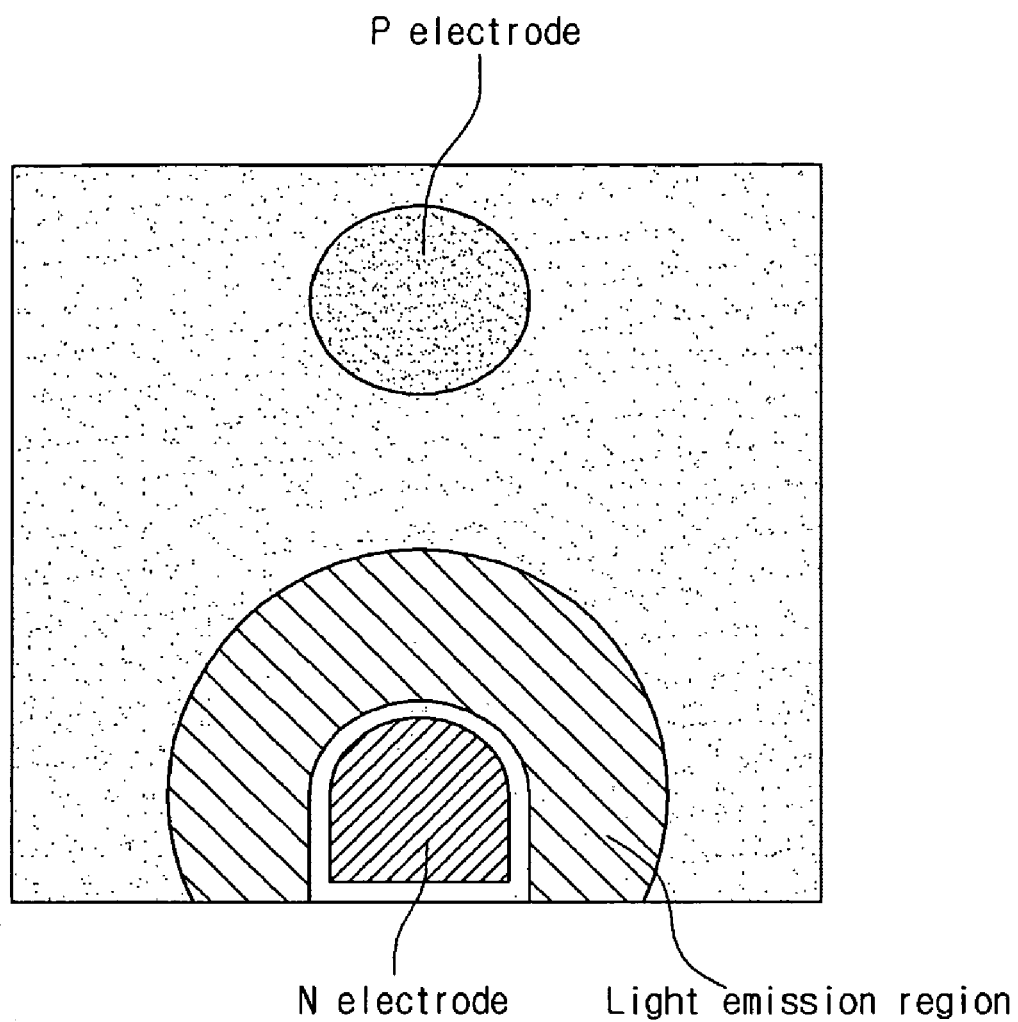
FIGS. 3a and 3b are views illustrating a light emission region of a related-art light emitting diode.
Figure 3B:
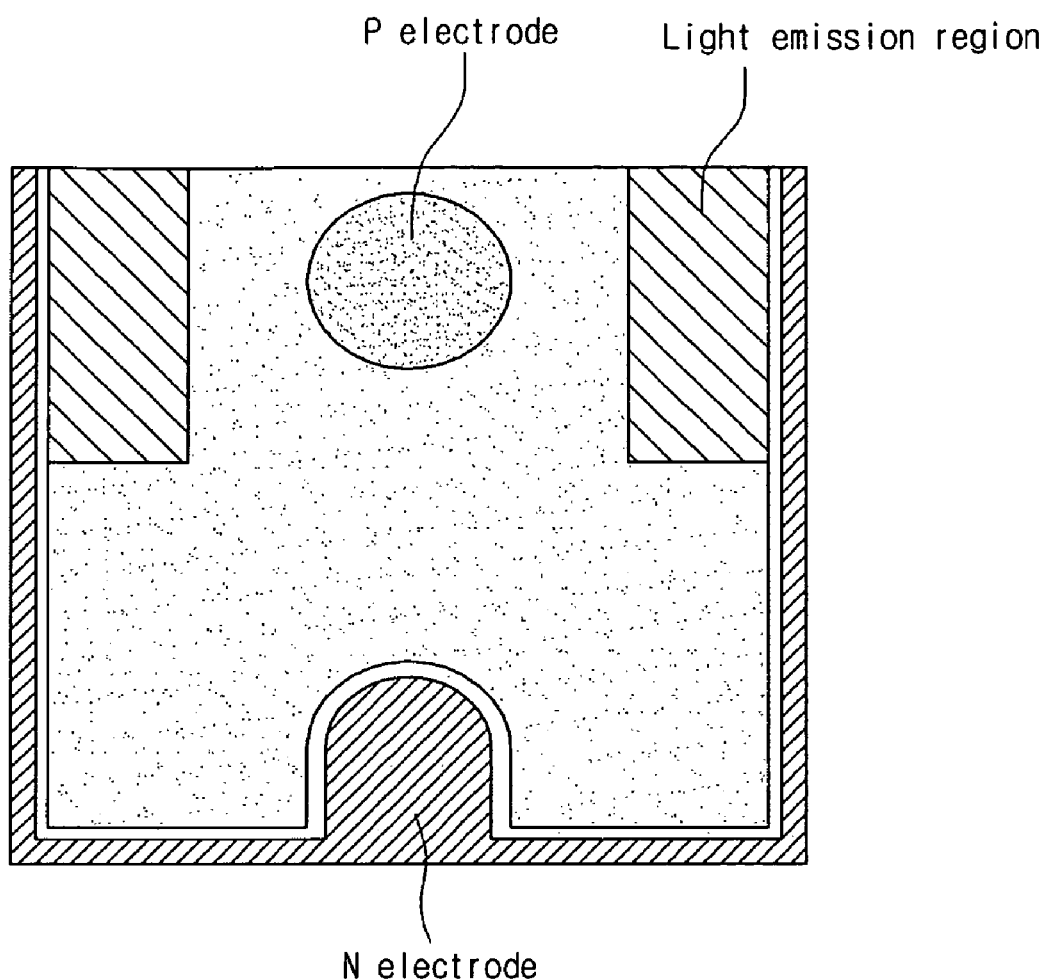
Figure 4:
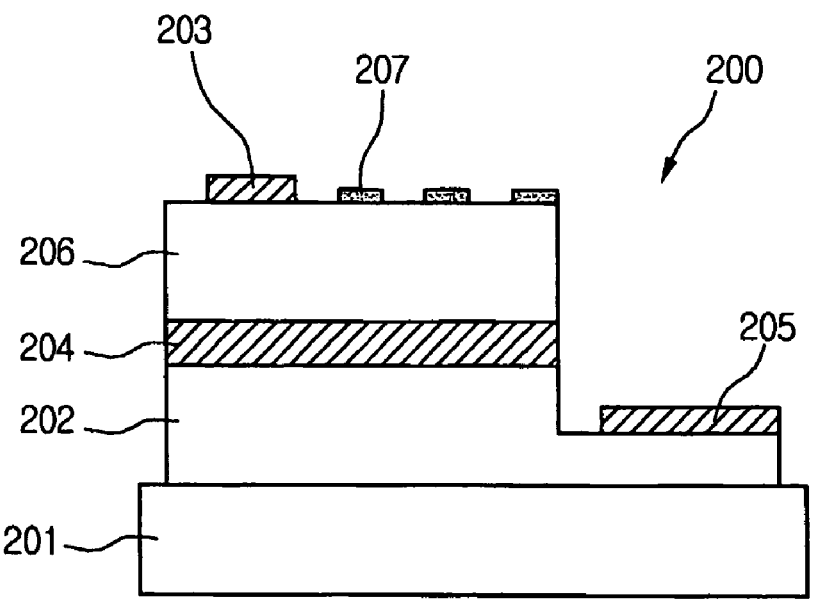
FIG. 4 is a view illustrating a light emitting diode according to the first embodiment of the present invention.

FIG. 4 is a view illustrating a light emitting diode according to the first embodiment of the present invention.

As shown in FIG. 4, an N-type nitride gallium (GaN) layer 202 is formed on a sapphire substrate 201 and then, an N-type electrode 205 is formed at one portion of and on the N-type nitride gallium layer 202.

After that, an active layer 204 is formed at the other portion of and on the N-type nitride gallium layer 202. The active layer 204 functioning as a light emission region has a quantum well structure comprising a Indium gallium Nitride. After the active layer 204 is formed, a P-type nitride gallium layer 206 is formed.

The P-type nitride gallium layer 206 is contrasted with the N-type nitride gallium layer 202, and is formed by the addition of P-type dopants. Therefore, in the N-type nitride gallium layer 202, electrons are drifted by an external voltage. In the P-type nitride gallium layer 206, holes are drifted by the external voltage. The electrons and the holes are recombined with each other to emit light.

The transparent metal-based transparent electrode 207 is formed to have a stripe structure on the P-type nitride gallium layer 206, thereby improving a transmittance of light generated from the active layer 204. The transparent electrode 207 can be a Transparent Metal (TM) layer using a transparent metal material.

Figure 5:
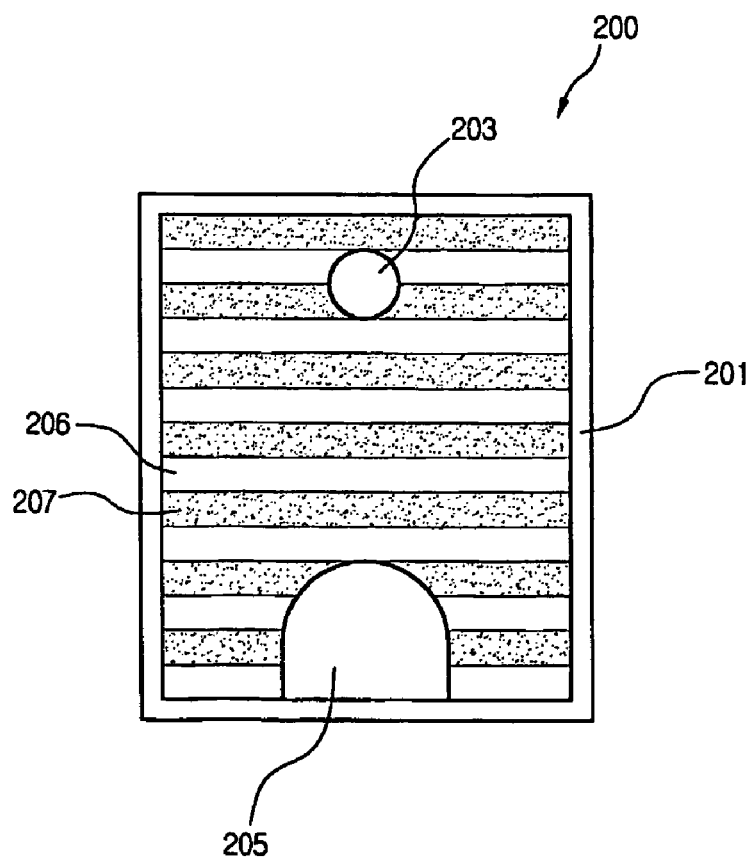
FIG. 5 is a plan view illustrating a transparent electrode, a P-type electrode, and an N-type electrode of a light emitting diode according to the first embodiment of the present invention.

FIG. 5 is a plan view illustrating a transparent electrode, a P-type electrode, and an N-type electrode of a light emitting diode according to the first embodiment of the present invention.

As shown in FIG. 5, the P-type electrode 203 and the N-type electrode 205 of the light emitting diode 200 are disposed at both portions of the light emitting diode 200. The N-type electrode 205 is disposed to have a predetermined step height.

The sapphire substrate 201, the nitride gallium layer, the active layer and the like are disposed down of the P-type electrode 203. Accordingly, the P-type electrode 203 is disposed higher than the N-type electrode 205.

The transparent electrode 207 has a stripe structure on a whole surface of the light emitting diode 200 excepting a contact portion of the P-type electrode 203 and the n-type electrode. In detail, the transparent electrodes 207 are regularly spaced apart from one another at a whole region of the light emitting diode 200.

Accordingly, after the P-type nitride gallium layer 206 is formed on the active layer, the transparent electrode 207 is disposed on the P-type nitride gallium layer 206 to have a slit shape, thereby partially exposing the P-type nitride gallium layer 206.

Therefore, an amount of light generated from the active layer is minimally absorbed by the transparent electrode 207, thereby increasing an amount of an externally emitting light.

As described above, the stripe-shaped transparent electrode 207 can be formed using a silicon oxide ($SiO_2$) or an exposure process. A description thereof is made with reference to FIGS. 6a through 6c and FIGS. 7a through 7c.

A process of forming the transparent electrode 207 is as follows.

Figure 6A:
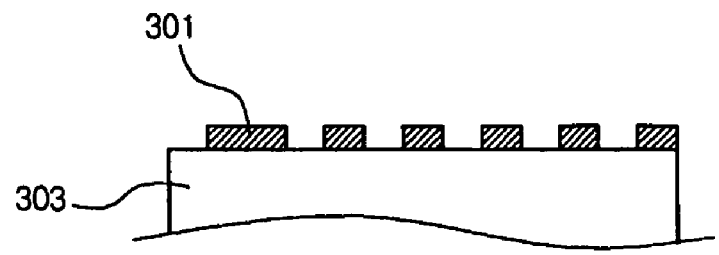
FIGS. 6a through 6c are views illustrating a method of forming a stripe-structured transparent electrode according to the first embodiment of the present invention.
Figure 6B:
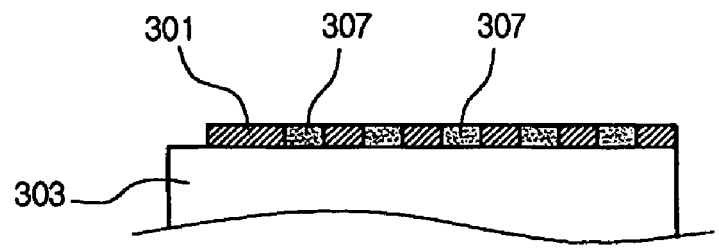
Figure 6C:
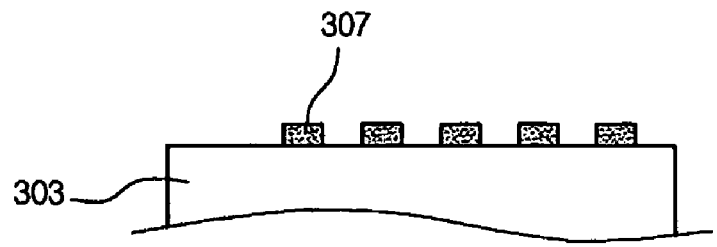

FIGS. 6a through 6c are views illustrating a method of forming the stripe-structured transparent electrode according to the first embodiment of the present invention.

As shown in FIG. 6a, if a P-type nitride gallium layer 303 is formed, a transparent electrode pattern 301 is formed with a stripe shape by using a mask for a P-type electrode, an N-type electrode and a stripe-shaped transparent electrode, and using a silicon oxide ($SiO_2$) material.

After that, as shown in FIG. 6b, a transparent electrode 307 layer is deposited on the P-type nitride gallium layer 303 having the transparent electrode pattern 301. After that, as shown in FIG. 6c, the $SiO_2$ transparent electrode pattern 301 is etched out to form the stripe-shaped transparent electrode 307.

Figure 7A:
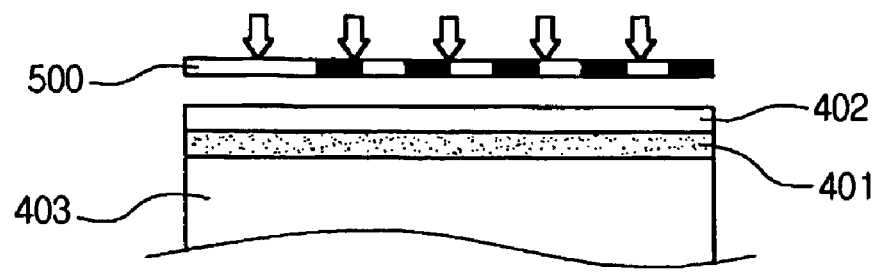
FIGS. 7a through 7c are views illustrating a method of forming a transparent electrode according to another embodiment of the present invention.
Figure 7B:
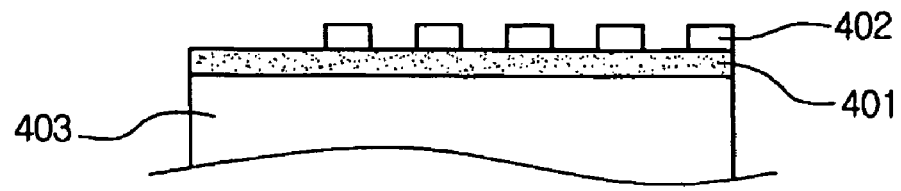
Figure 7C:
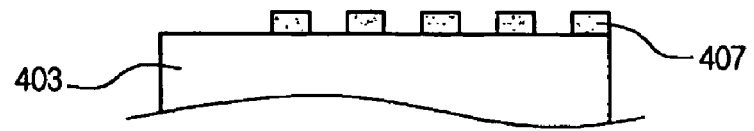

FIGS. 7a through 7c are views illustrating a method of forming a transparent electrode according to another embodiment of the present invention.

As shown in FIG. 7a, a transparent metal film 401 is deposited on a P-type nitride gallium 403. After that, a photoresist film 402 is coated on the resultant.

A slit-structured mask 500 is positioned on the photoresist film 402. An exposure process and a developing process are performed to form a stripe-shaped photoresist pattern 402 as shown in FIG. 7b.

After that, as shown in FIG. 7c, an etching process using the photoresist pattern 402 is performed to form a stripe-shaped transparent electrode 407.

As such, the present invention allows the transparent electrode 407 to have a stripe structure at a P-type region of the light emitting diode, thereby reducing an absorbed amount of light of the transparent electrode before the light of the active layer is emitted to the external.

Meanwhile, the above-described embodiment exemplarily illustrates an NP-type light emitting diode, but can be easily applied to an NPN-type light emitting diode as well as the NP-type light emitting diode. In detail, assuming that the N-type nitride gallium layer 202 is a first nitride gallium layer and the P-type nitride gallium layer 206 is a second nitride gallium layer, an N-type third nitride gallium layer can be additionally formed on the second nitride gallium layer. The present invention can be also applied to an NPN-type light emitting diode.

It can be also easily understood, from the following other embodiments of the present invention, that the present invention can be applied to the NP-type, NPN-type or other-type light emitting diode.

Figure 8:
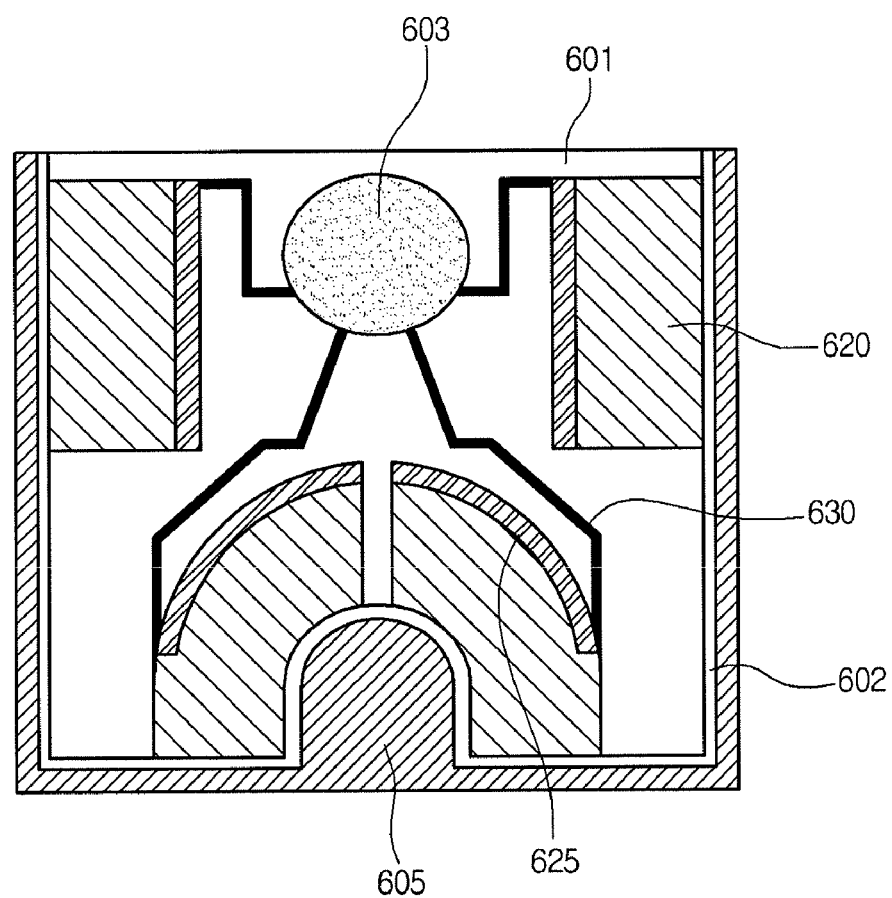
FIG. 8 is a view illustrating an electrode structure of a light emitting diode according to the second embodiment of the present invention.

FIG. 8 is a view illustrating an electrode structure of a light emitting diode according to the second embodiment of the present invention.

As shown in FIG. 8, a top view of the electrode structure of the light emitting diode is illustrated.

After an N-type nitride gallium layer, an active layer, and a P-type nitride gallium layer are sequentially formed above a sapphire substrate, a P-type electrode 603 and an N-type electrode 605 are formed as shown in FIG. 8. The inventive light emitting diode has a plurality of partition regions excepting a P-type electrode 603 and an N-type electrode 605 disposed at an upper layer of the light emitting diode. Transparent electrodes 620 are disposed at the plurality of partition regions.

The plurality of partitioned transparent electrodes 620 is disposed at a region at which a majority of light substantially is emitted from the active layer. The transparent electrode 620 can be a transparent metal layer, as in other embodiments below.

Additionally, there is a connection portion 625 of the transparent electrode 620 and the metal film 630 having the same thickness as the p-type electrode, thereby constantly maintaining an electrical connection and a voltage applied to the active layer.

Additionally, a connection portion of the transparent electrode 620 and the metal film 630 has the same thickness as the P-type electrode, thereby constantly maintaining an electrical connection and a voltage applied to the active layer.

Since the P-type nitride gallium layer generally has a very low conductivity, the plurality of transparent electrodes 620 is electrically disconnected with one another excepting the metal film 630 having the in-series resistance value.

Each of the plurality of partitioned transparent electrodes can independently control voltages for allowing holes and electrons to be recombined with each other. Accordingly, this can be used to control a light biased-concentration phenomenon caused by a voltage drop.

For example, the metal films 630 can be selected to apply a constant voltage to each of the partitioned transparent electrodes 620 under a constant driving current for driving the light emitting diode.

Accordingly, since the voltage applied to the active layer is constantly maintained at a whole region of each of the transparent electrodes 620, the light biased-concentration can be prevented.

Further, in case where an over current unnecessarily flows through any one of the metal films 630 for connecting the partitioned transparent electrodes 620 with the P-type electrode 603, the any one metal film 630 has a voltage drop increased at its resistance value. At this time, a rise of the voltage applied to the active layer is suppressed as much as the voltage drop increased at the resistance value.

As such, a negative feedback phenomenon for suppressing the current applied to the active layer is caused, thereby providing an effect of stabilizing a driving current.

From a phenomenon in which a turn-on voltage of the active layer is reduced depending on a temperature rise, it can be understood that a stabilization effect of the in-series resistance is of much importance for the driving current.

FIGS. 9 through 12 are views illustrating electrode structures of light emitting diodes according to the third to sixth embodiments of the present invention.

Figure 9:
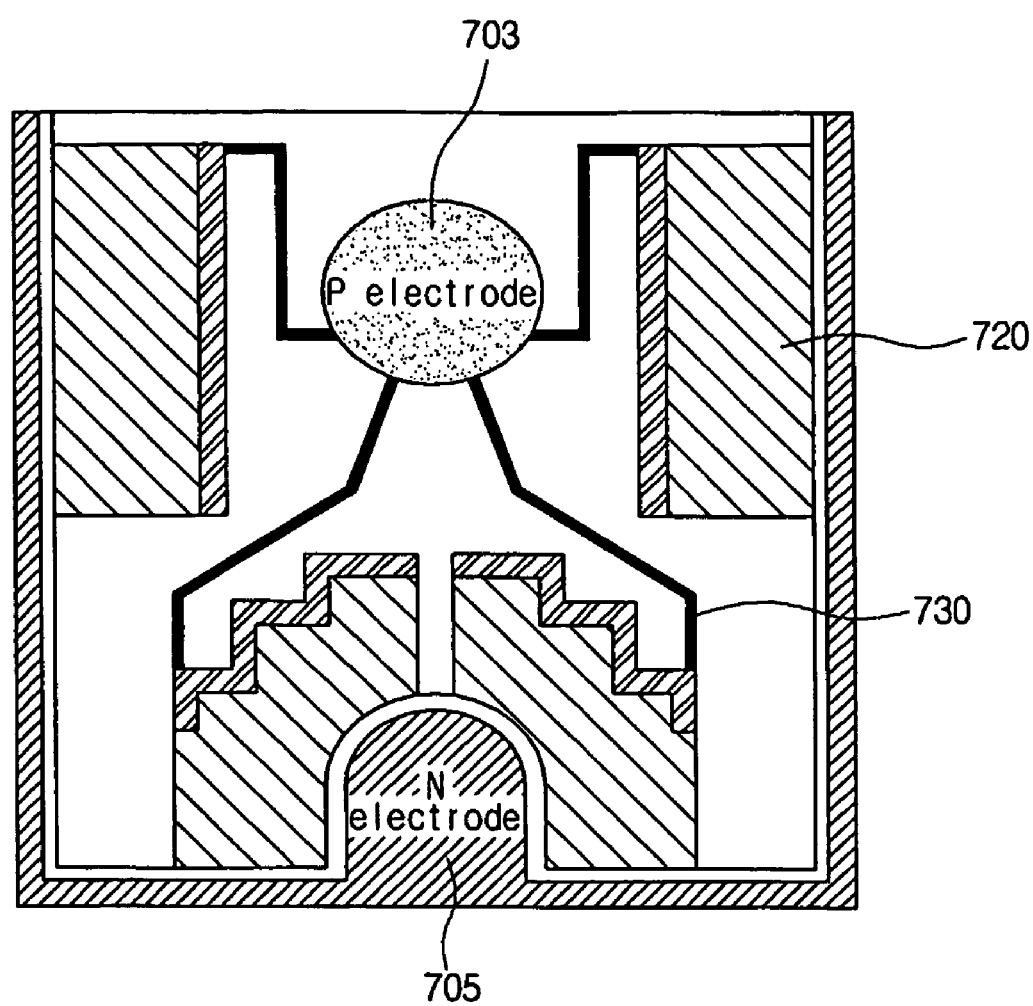
FIGS. 9 through 12 are views illustrating electrode structures of light emitting diodes according to the third to sixth embodiments of the present invention.

As shown in FIG. 9, an electrode structure of the light emitting diode has a P-type electrode 703 disposed at an upper portion of the light emitting diode, and an N-type electrode 705 disposed along an upper circumference of the light emitting diode.

As shown in FIG. 8, four transparent electrodes 720 are partitioned and provided. The transparent electrodes 720 disposed at an adjacent region of the N-type electrode 705 have step-shapes. The metal films 730, which electrically connect the P-type electrode 703 with the transparent electrodes 720, can be controlled in length and width to control the resistance value.

Figure 10:
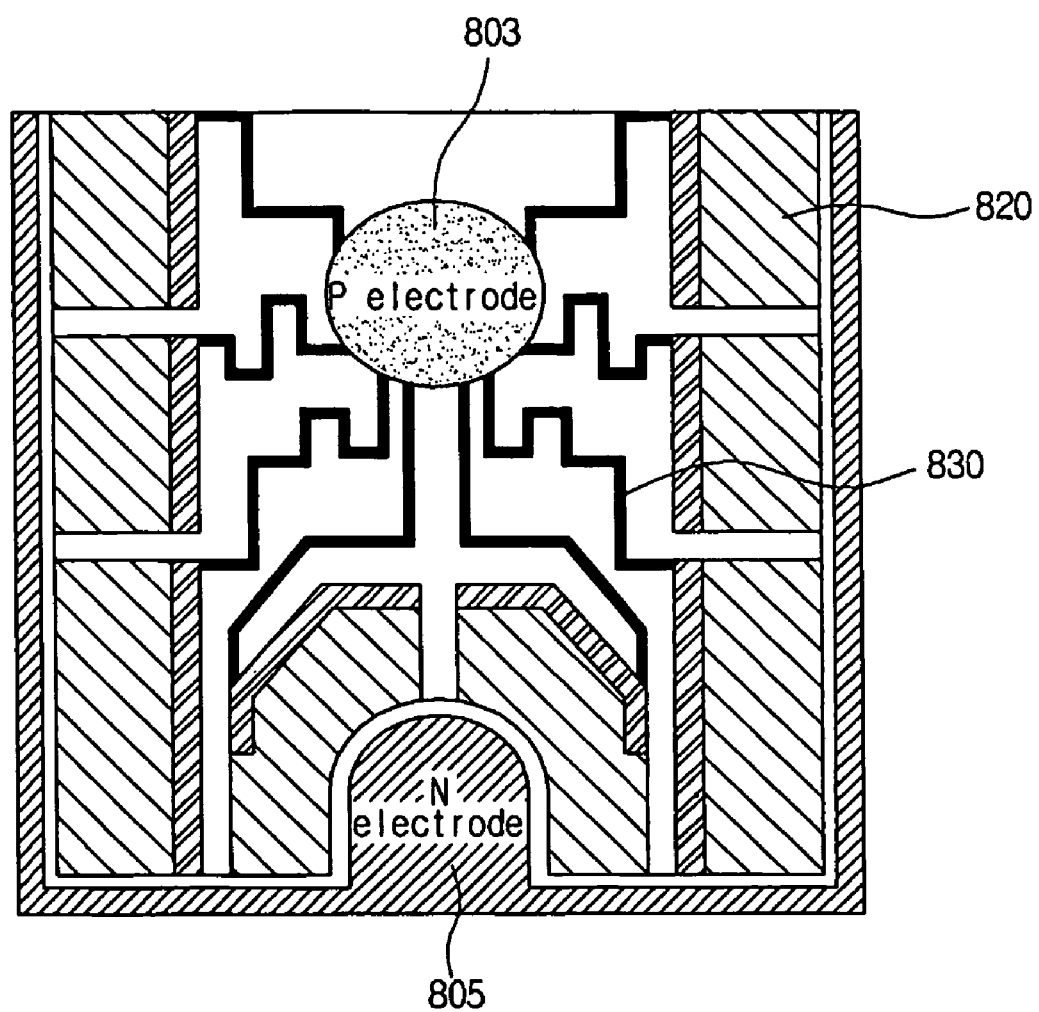

An electrode structure of the light emitting diode of FIG. 10 has eight transparent electrodes unlike that of FIG. 9.

In other words, eight transparent electrodes 820 are partitioned and disposed along an N-type electrode 805 disposed along an upper circumference of the light emitting diode. Metal films 830, which electrically connect the eight transparent electrodes 820 and the P-type electrode 803, have a concavo-convex shape on a P-type nitride gallium layer to respectively have different resistance values.

Figure 11:
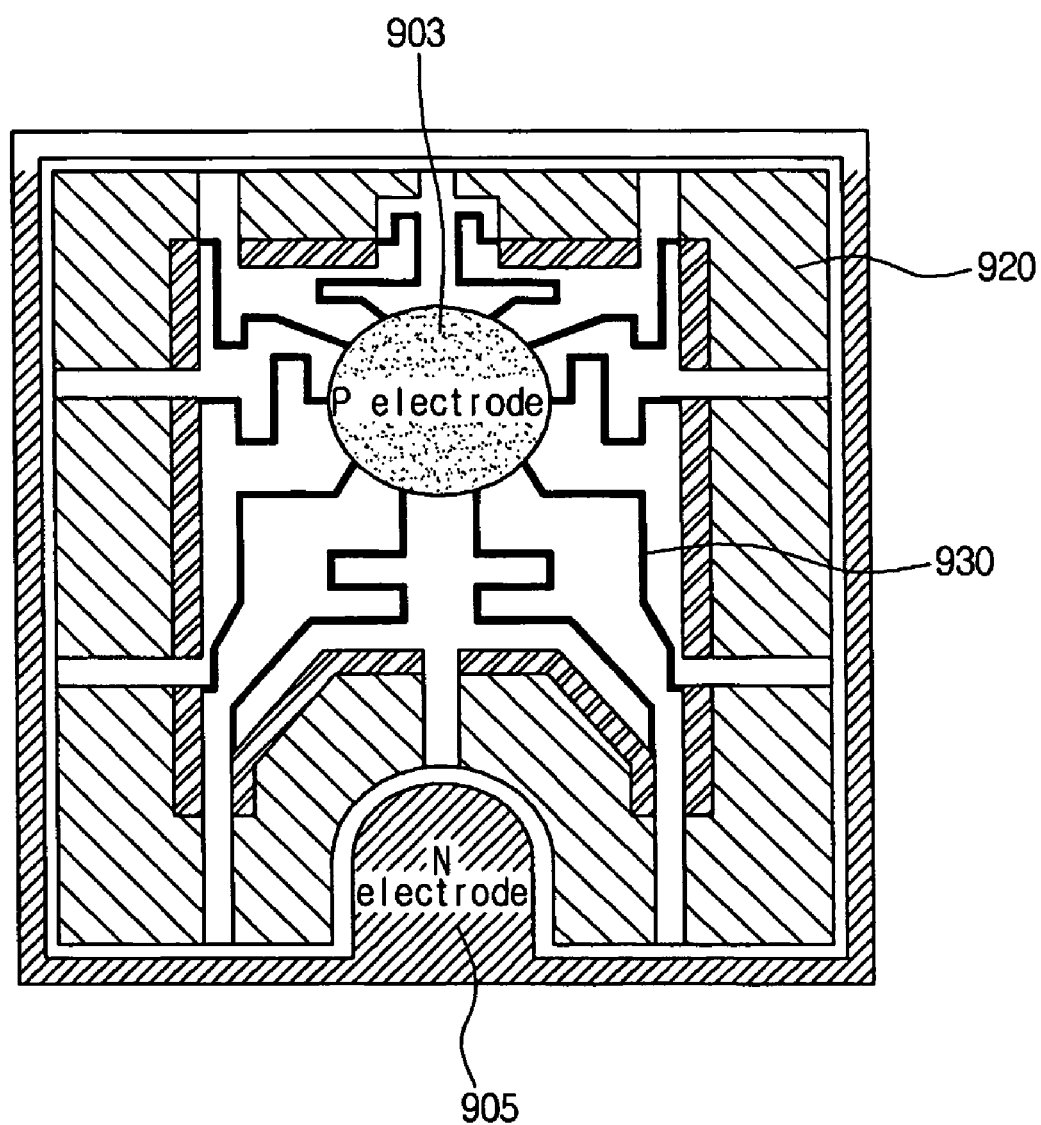
Figure 12:
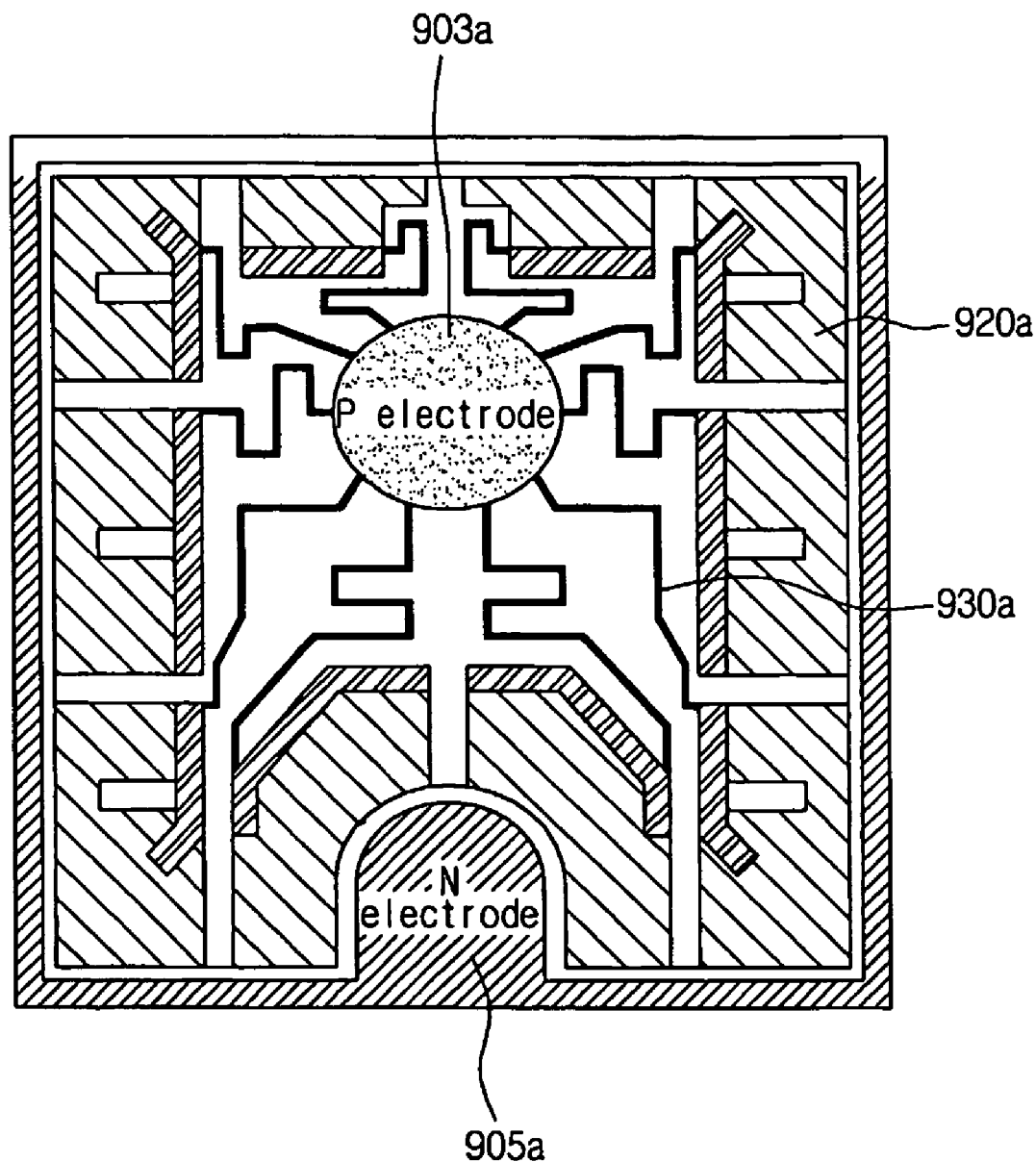

In the fifth and sixth embodiments of FIGS. 11 and 12, ten transparent electrodes 920 and 920a are respectively partitioned and disposed at upper electrode regions of the light emitting diodes. Patterns of the transparent electrodes 920 and 920a are different from each other in FIGS. 11 and 12. As the same effect, a voltage applied to an active layer is constantly maintained to prevent a light biased-concentration phenomenon.

In the electrode structures of the light emitting diodes of FIG. 8 through 12, the transparent electrodes are partitioned in plural, and the metal films are disposed to electrically connect the P-type electrodes with the transparent electrodes. The metal films vary in length and width to control their resistance values.

Additionally, the transparent electrodes have the same thickness as the P-type electrodes such that constant voltages can be applied to the active layers.

Figure 13A:
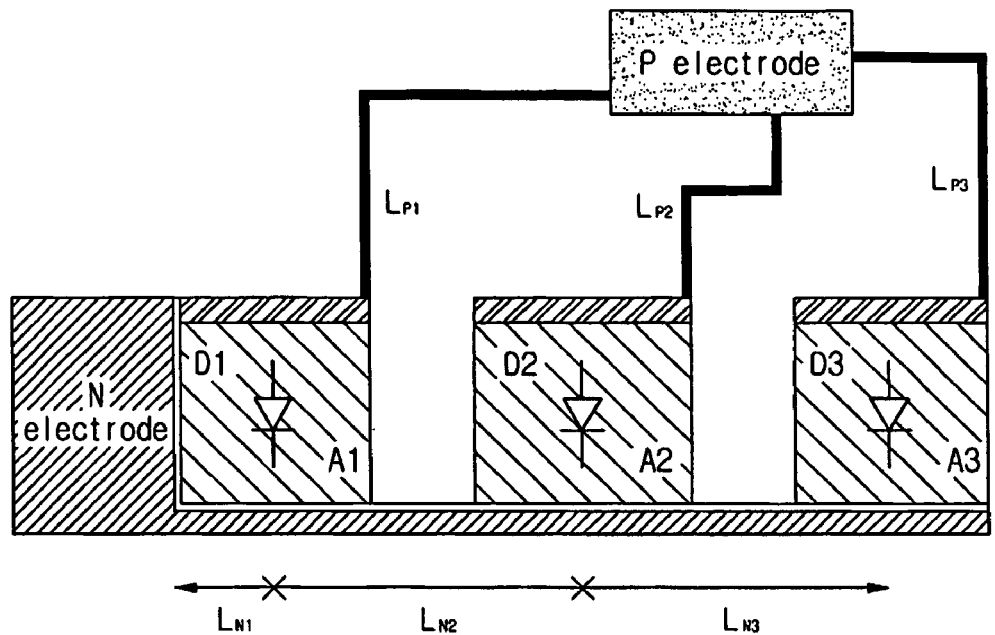
FIGS. 13a and 13b are views illustrating an electrode structure and its circuit diagram of a light emitting diode according to the present invention.
Figure 13B:
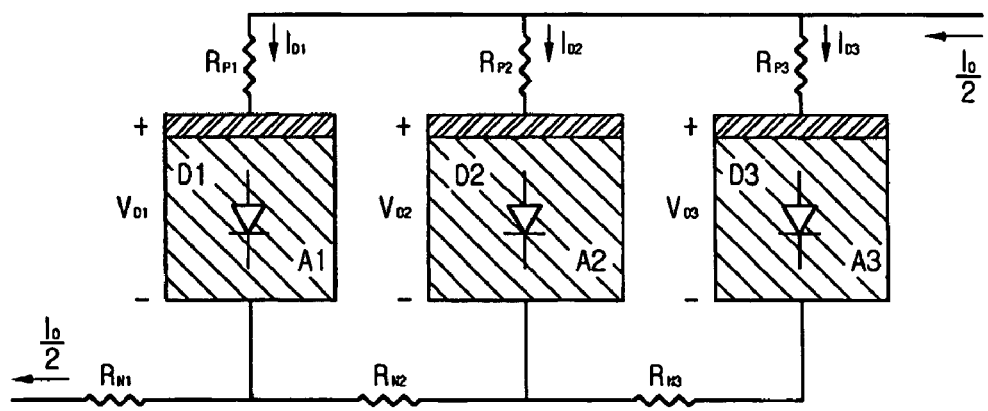

FIGS. 13a and 13b are views illustrating an electrode structure and its circuit diagram of a light emitting diode according to the present invention.

As shown in FIGS. 13a and 13b, a constant current is always applied to a plurality of partitioned transparent electrodes and an N-type electrode. This is proved as in the following Equation.

$$A\_T = A\_1 + A\_2 + A\_3 \tag{Equation}$$

where,
A: areas of the partitioned transparent electrodes.

$$I_{D1} = \frac{A_1}{A_T}\frac{I_O}{2} I_{D2} = \frac{A_2}{A_T}\frac{I_O}{2} I_{D3} = \frac{A_3}{A_T}\frac{I_O}{2}$$

where,
$I_D$: currents applied to the partitioned transparent electrodes
$I_O$: driving current.

$$V\_D1 == V\_D2 == V\_D3$$

where,
VD: voltages applied to the transparent electrodes. Since the same voltage is applied to the transparent electrodes, it can be understood that the transparent electrodes are connected in parallel.

$$V\_D1 = V\_0 - R\_P1I\_D1 - R\_N1(I\_D1 + I\_D2 + I\_D3)$$

$$V\_D2 = V\_0 - R\_P2I\_D2 - R\_N2(I\_D2 + I\_D3) - R\_N1(I\_D1 + I\_D2 + I\_D3)$$

$$V\_D3 = V\_0 - R\_P3I\_D3 - R\_N2(I\_D2 + I\_D3) - R\_N1(I\_D1 + I\_D2 + I\_D3) - R\_N3I\_D3$$

$$R_{P2} = R_{P1}\frac{I_{D1}}{I_{D2}} - R_{N2}\frac{I_{D2}+I_{D3}}{I_{D2}} = R_{P1}\frac{A_1}{A_2} - R_{N2}\frac{A_2+A_3}{A_2}$$

$$R_{P3} = R_{P2}\frac{I_{D2}}{I_{D3}} - R_{N3}\frac{I_{D3}}{I_{D2}} = R_{P2}\frac{A_2}{A_3} - R_{N3}\frac{A_3}{A_2}$$

where,
Rp: resistance value of the metal film
Rn: resistance value between the metal film and the N-type electrode.

As such, in order to prevent the light emission of the related-art light emitting diode from being biased and concentrated only at a specific portion of the electrode, the present invention has the plurality of transparent electrodes disposed to connect with the P-type electrode, thereby constantly maintaining the voltage applied to the active layer.

Industrial Applicability

As described above, the inventive light emitting diode has an effect in that the transparent electrode is disposed at the contact portion of the P-type electrode to have the stripe shape such that the amount of light generated from the active layer is minimally absorbed by the transparent electrode, thereby enhancing the light efficiency.

Further, the inventive light emitting diode has an effect in that the plurality of transparent electrodes is partitioned and disposed at the contact portion of the P-type electrode, thereby emitting a constant high brightness of light.

Furthermore, the inventive light emitting diode has an effect in that the constant voltage can be maintained in the active layer.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

The invention claimed is:

1. An LED, comprising:
a first gallium nitride layer;
a first electrode at one portion of and above the first gallium nitride layer;
an active layer above the first gallium nitride layer;
a second gallium nitride layer above the active layer;
a plurality of transparent electrodes on the second gallium nitride layer, wherein one of the plurality of transparent electrodes is electrically connected to, and is physically isolated from, another of the plurality of transparent electrodes;
a second electrode above the second gallium nitride layer; and
a plurality of connection units directly in contact with the second gallium nitride layer, each connection unit electrically connecting a respective one of the plurality of transparent electrodes with the second electrode.

2. The LED according to claim 1, wherein the plurality of transparent electrodes comprise at least three patterns.

3. The LED according to claim 1, wherein the plurality of connection units directly connect the second electrode with a respective one of the plurality of transparent electrodes.

4. The LED according to claim 1, wherein the plurality of transparent electrodes, the second electrode and the plurality of connection units are formed directly on the second gallium nitride layer.

5. The LED according to claim 1, wherein the plurality of transparent electrodes are co-planar.

6. The LED according to claim 1, wherein the plurality of connection units are formed of metal films.

7. The LED according to claim 1, wherein the plurality of transparent electrodes are disposed directly above corresponding physically separated locations of a surface of the second gallium nitride layer.

* * * * *